United States Patent [19]
Rynders et al.

[11] Patent Number: 5,520,069
[45] Date of Patent: May 28, 1996

[54] SYNCHRONIZED LEVER MECHANISM FOR INSERTION AND REMOVAL OF MODULES IN HOUSINGS

[75] Inventors: Rudolf R. Rynders, Boise; Darrel W. Poulter, Middleton, both of Id.

[73] Assignee: Hewlett-Packard Company, Palo Alto, Calif.

[21] Appl. No.: 331,452

[22] Filed: Oct. 31, 1994

[51] Int. Cl.$^6$ ..................................................... G05G 1/04
[52] U.S. Cl. .................. 74/520; 74/543; 74/546
[58] Field of Search ............................ 74/543–548, 519, 74/520, 522.5, 528, 531, 516

[56] References Cited

U.S. PATENT DOCUMENTS

| | | | |
|---|---|---|---|
| 3,339,051 | 8/1967 | De Vall | 74/544 |
| 4,265,141 | 5/1981 | Bowman | 74/520 X |
| 4,449,421 | 5/1984 | Olschewski et al. | 74/516 |
| 4,523,395 | 6/1985 | Borsoi | 74/520 X |
| 4,771,643 | 9/1988 | Mott | 74/520 X |
| 4,823,902 | 4/1989 | Onishi et al. | 74/520 X |
| 5,193,666 | 3/1993 | Markowski et al. | 74/546 X |
| 5,297,444 | 3/1994 | Kriner et al. | 74/520 |

FOREIGN PATENT DOCUMENTS

| | | | |
|---|---|---|---|
| 246513 | 4/1981 | France | 74/520 |
| 2700813 | 7/1977 | Germany | 74/543 |
| 3930263 | 4/1993 | Germany | 74/520 |

*Primary Examiner*—Vinh T. Luong

[57] ABSTRACT

A lever mechanism for the insertion and removal of a module in a housing includes two levers the proximal ends of which are pivotally mounted to the module at spaced locations on the module. The distal ends of the levers are disposed in confronting relationship when the levers are longitudinally aligned. A leaf spring is longitudinally slidably mounted to the levers including sliding attachment to the levers at their distal ends. The leaf spring is sufficiently stiff to maintain spatial alignment of the distal ends of the levers during angular movement. Arcuate sectors branching from the levers adjacent their distal ends overlap and provide handles for manually operating the levers. Latches correspondingly positioned at the proximal ends of the levers cooperate with catches in the opening or slot in the housing in which the module is inserted to provide the final insertion or removal forces for insertion and removal of the module with respect to the housing.

9 Claims, 7 Drawing Sheets

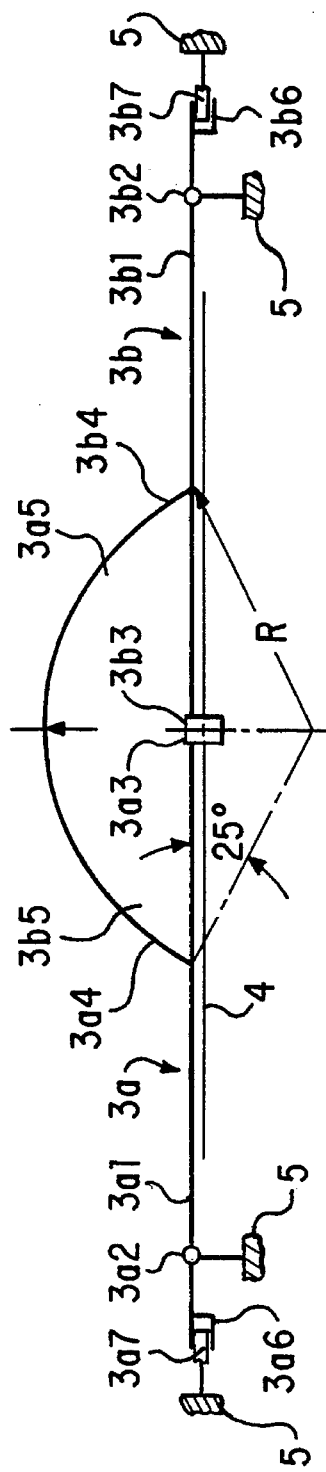
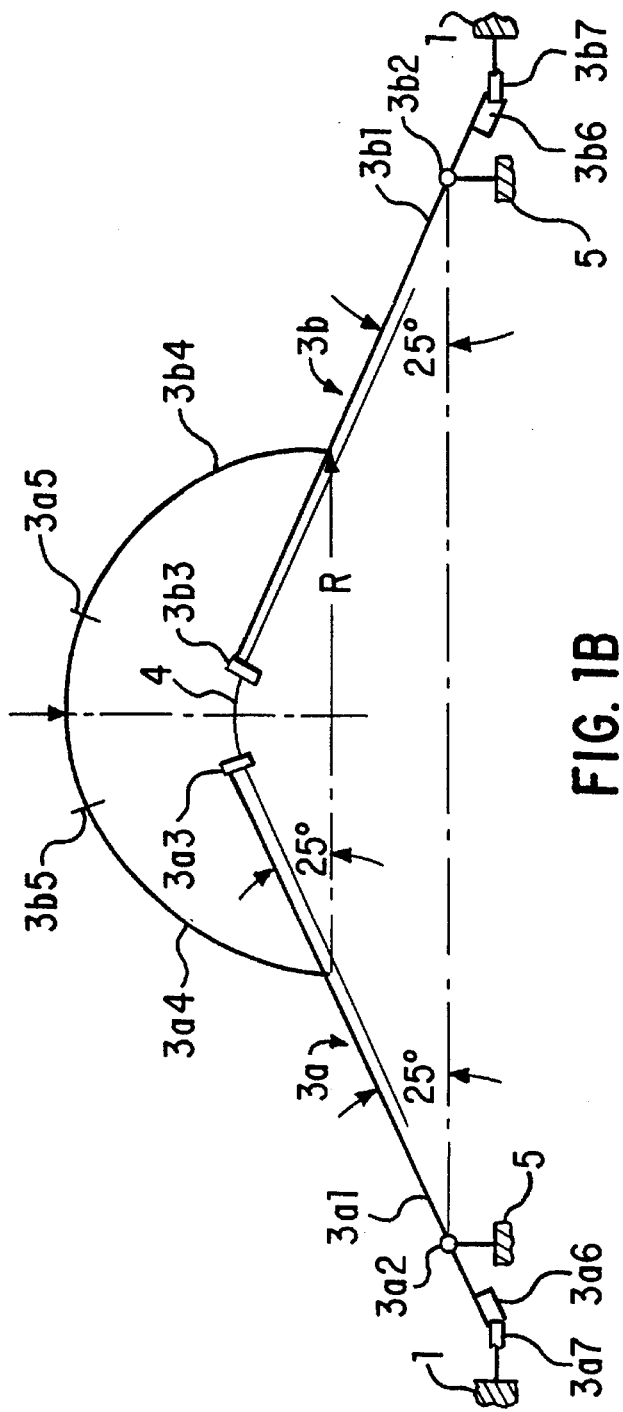

5,520,069

SYNCHRONIZED LEVER MECHANISM FOR INSERTION AND REMOVAL OF MODULES IN HOUSINGS

TECHNICAL FIELD

This invention relates generally to a mechanism for the insertion and removal of modules from housings, in which lever mechanisms are employed to insert and remove the modules from the housings of systems of which the modules comprise a cooperative part.

BACKGROUND OF THE INVENTION

The modular implementation of systems in which modular parts of a system are assembled in housings and functionally interconnected by connections which are coupled together by module insertion, has required the careful design of housings and of modules. The purpose of this is to guide the modules for precise mating of module and housing parts, such as multi-pin connectors, to obviate connector damage as a result of misalignments.

Connectors with a multitude of contact pins require precise alignment of the connector parts prior to contact pin engagement, require a properly directed force for contact pin engagement and requires sufficient force to ensure complete engagement.

The simultaneous engagement of the contact pins with the pin receptacles with a force which is axially aligned with the contact pins is a necessity to ensure that no pins are bent in the insertion process. This requires a housing track or slot for the module which properly steers the connector part on the module being inserted to the mating connector part in the housing.

Some modules which perform complex functions in systems may have long narrow connectors. Here the slightest tilt of the module makes it difficult to achieve simultaneous end-to-end engagement of the contact pins. In such an application, balanced forces must be coupled to the module between the module and the housing at spaced locations on the module to position the connector parts on the module in parallel relationship with the mating connector parts in the housing and to move the module, maintaining that parallel connector relationship and applying the force necessary to fully engage the connector parts.

Interlocked lever systems have been employed for such applications. Rods and/or gears, located internally of the module have been employed in the past to interconnect the levers so that the levers move together in displacing the module to engage the connector parts. This requires space within the module to accommodate such mechanisms. The increased packing density of essential functional system parts in the module presently, frequently negates such lever interconnections internally of the module.

An interconnect lever system for module insertion and removal is needed which requires no lever interconnections internally of the module and which requires no lever interconnections externally of the lever mechanisms to achieve synchronous movement of the levers.

SUMMARY OF THE INVENTION

A device such as a module adapted for insertion into a slot in a system housing has an interconnected lever mechanism or structure mounted thereon. Two levers are employed. The levers have proximal ends which are pivotally mounted at spaced locations adjacent opposite edges of the module and have confronting distal ends which mount handles in the shape of arcuate sectors disposed in side by side overlapping relationship.

The levers are mechanically interconnected by a leaf spring which is longitudinally, slidably mounted to both levers and slidably bridges the levers across their distal ends. The levers are movable between two extreme positions with respect to the module, a released position in which the levers are pivoted outwardly of the end of the module, the leaf spring maintaining the distal ends of the levers in spatial alignment, and a latched position in which the levers are pivoted to a position in the end of the module in which the levers are in substantially longitudinal alignment.

The levers each have latch members thereon, which are equally spaced from the pivots at the proximal ends of the levers, the slot in the system housing has a cooperative catch member therein for each latch member on the levers. The module is manually inserted into the slot in the system housing with the lever mechanism in released position. When the respective latch members on the levers on the module engage the respective catch members in the openings or slots in the system housing, the module is aligned in the slot. The application of manual pressure simultaneously to the overlapping arcuate sectors moves the levers together. Synchronous movement of the levers is guaranteed by the leaf spring which slidably engages and bridges the levers at their distal ends. The latch members on the levers in engagement with the catch members in the system housing slots, displace the module, maintaining proper alignment of the module in the slot in the system housing as the levers move to latched position.

BRIEF DESCRIPTION OF THE DRAWINGS

The invention will be better understood by reference to the following descriptive disclosure when considered in conjunction with the accompanying drawings in which:

FIGS. 1A and 1B are diagrammatic illustrations of a lever system embodying the principles of this invention, showing the lever mechanism in latched and released positions, respectively.

BEST MODE FOR PRACTICING THE INVENTION

Figure 2:
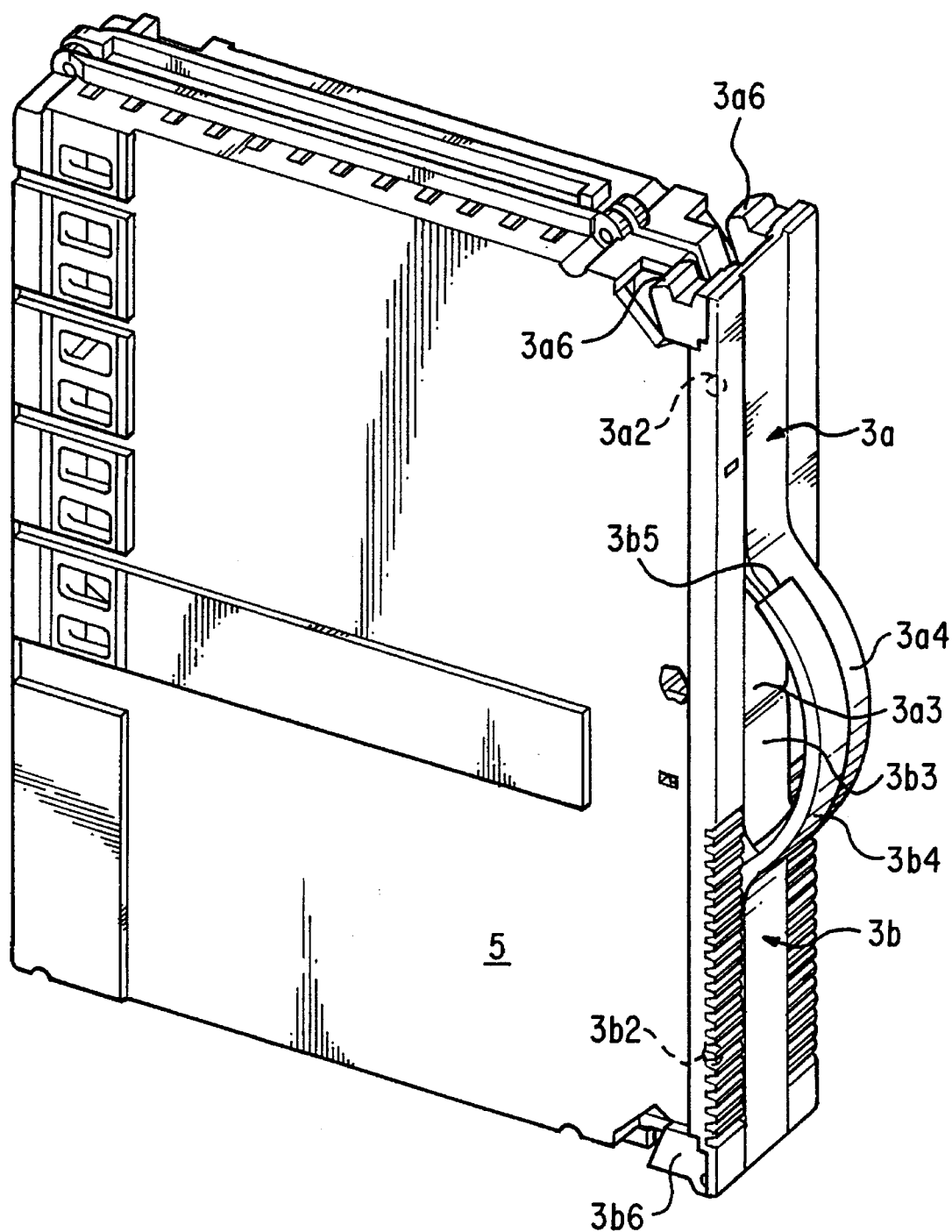
FIGS. 2 and 3 are isometric views of a module having a lever mechanism according to this invention.
Figure 3:
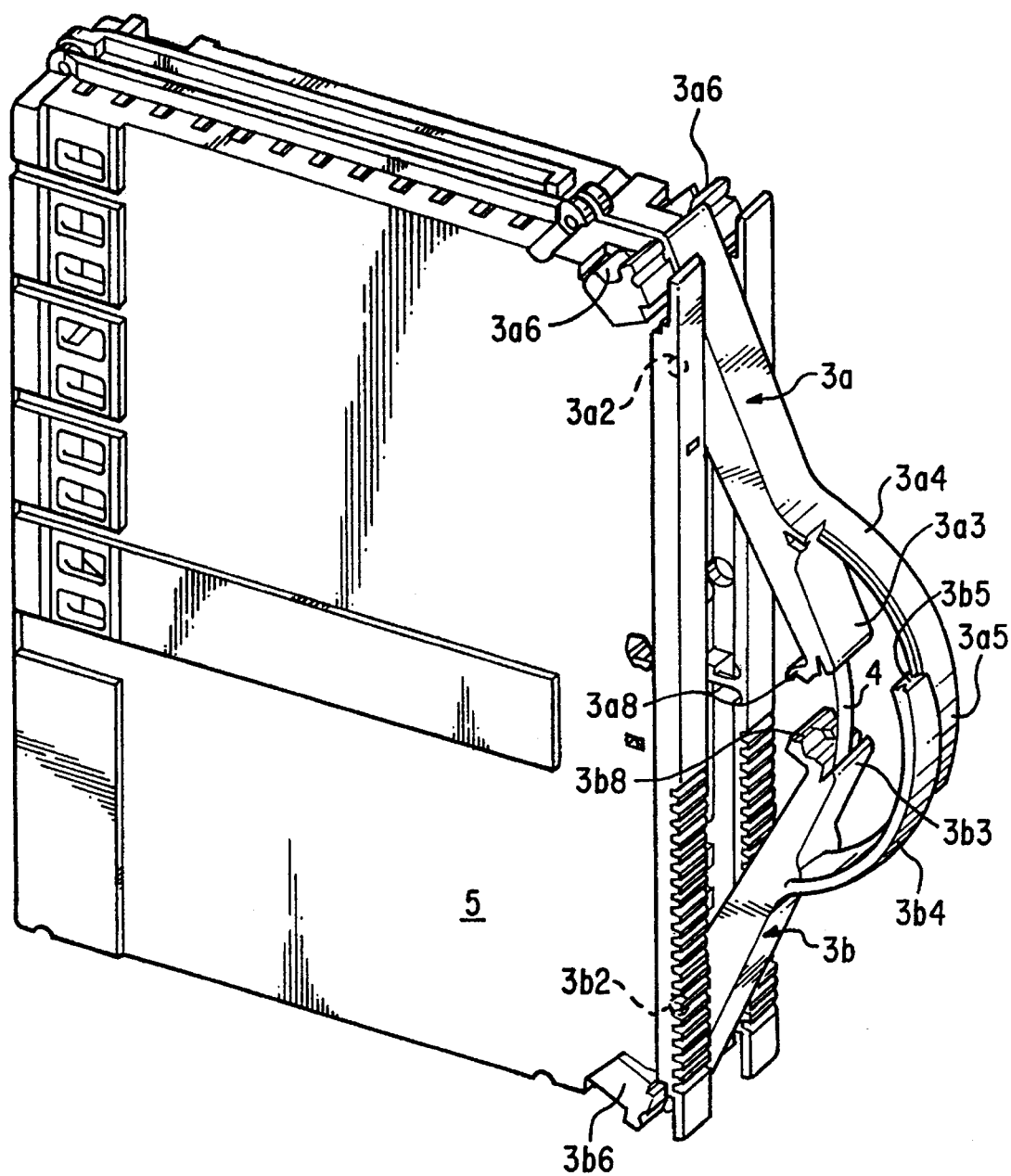

The geometry of a lever mechanism 3 embodying the principles of this invention, in each of its latched and released positions, is illustrated in FIGS. 1a and 1b, respectively. Respective levers 3a and 3b of a lever mechanism 3 have proximal ends 3a1, 3b1 which have fixed pivotal mounts 3a2 which are pivotally attached at spaced locations on a common support, such as a module 5 shown only fragmentarily in these illustrations. In the latched position of this lever mechanism 3, seen in FIG. 1A, the levers 3a, 3b are longitudinally aligned and their distal ends 3a3, 3b3 are disposed in confronting relationship. In FIG. 1B, the levers 3a, 3b, in released position, are equally angularly displaced, spacing apart their distal ends 3a3, 3b3, which, however, remain in correspondingly displaced spatial positions.

Each lever 3a, 3b comprises an arcuate sector 3a4, 3b4, branching from the lever adjacent its distal end 3a3, 3b3. The arcuate sectors 3a4, 3b4, overlap and function as handles. Their terminal ends are designated 3a5, 3b5, respectively. The arcuate sectors 3a4, 3b4 are correspondingly latterly offset in the same sense on the lever arms 3a, 3b, respectively, in which positions of the levers 3a, 3b the arcuate sectors 3a4, 3b4 overlap in side-by-side relationship, but are not slidably interlocked. The arcuate sectors 3a4, 3b4 are designed so that the arc radius R is the same in the angular extremes of the levers 3a, 3b, resulting only in a slight arcuate mismatch between the angular extremes.

A leaf spring 4 which extends longitudinally of the levers 3a, 3b, is hidably connected to the levers 3a, 3b and passes through a slot 3a9, 3b9 in each of the distal ends 3a3, 3b3, of the levers 3a, 3b. A pair of leaf spring pins 3a10, 3b10 are inserted into leaf spring slots 4a, 4b. Leaf spring pins 3a10, 3b10 are located so that when levers 3a, 3b are moved from the released position to the latched position, leaf spring slots 4a, 4b move relative to leaf spring pins 3a10, 3b10 so that leaf spring 4 is centered with respect to the location at which distal ends 3a3, 3b3 meet when levers 3a, 3b are in the latched position. The leaf spring 4 being stiff, functions to maintain the distal ends 3a3, 3b3, of the levers 3a, 3b in corresponding spatial positions as the levers 3a, 3b are angularly moved.

Angular movement of the levers 3a, 3b is accomplished by application of manual force simultaneously to both arcuate sectors 3a4, 3b4, in the directions indicated by the arrows in each of FIGS. 1A and 1B, to move the levers 3a, 3b from latched to released position and from released to latched position, respectively. Such simultaneous force application to the arcuate sectors 3a4, 3b4, moves the levers 3a, 3b synchronously, if precisely applied. The spring 4, however, ensures synchronicity within required limits.

The proximal end 3a1, 3b1 of each lever 3a4, 3b4 is provided with a latch member 3a6, 3b6, respectively. These latch members 3a6, 3b6 engage catch members 3a7, 3b7, respectively, on the system housing 1 as will be described.

Referring now to FIGS. 2–7 which illustrate the applicants' best mode for practicing the invention, one type of module 5 is illustrated which depicts a disk controller module 5 for an array of disk drives forming part of a redundant array of inexpensive disks devices (RAID). RAID systems comprise a housing 1, only fragmentarily shown, which is provided with spaces for receiving individual disk drives (not shown) and a housing opening defined by wall 6 and wall 7 of housing 1 for receiving the disk controller module 5. The disk controllers orchestrate the RAID system. One or more modules 5 may be employed in a RAID system.

Figure 4:
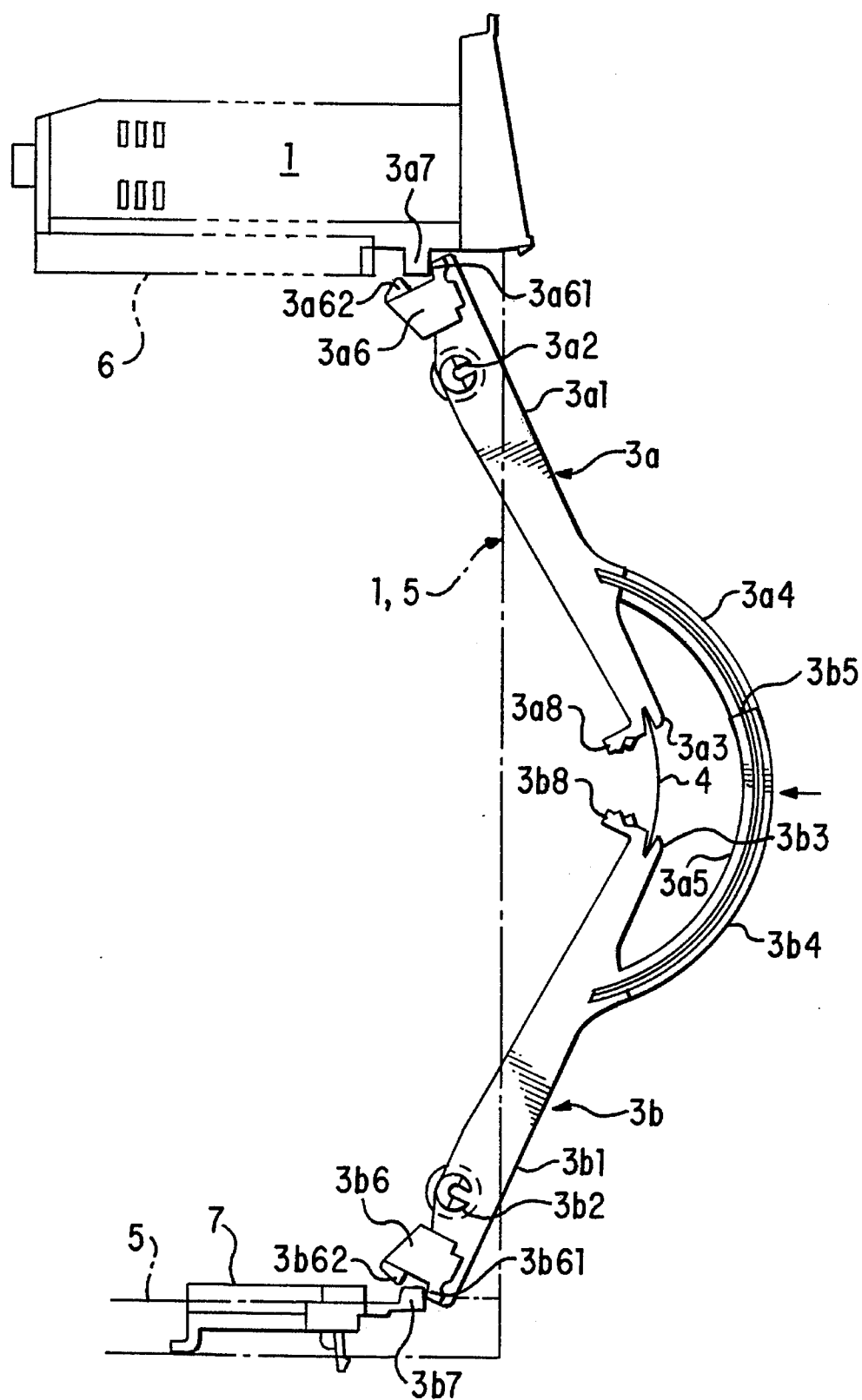
FIGS. 4 and 5 are side views of the lever system according to this invention, in released and latched positions, respectively, and illustrating the functional relationship of the lever parts in the module with the cooperating functional parts in the system housing in which the module is to be inserted.
Figure 5:
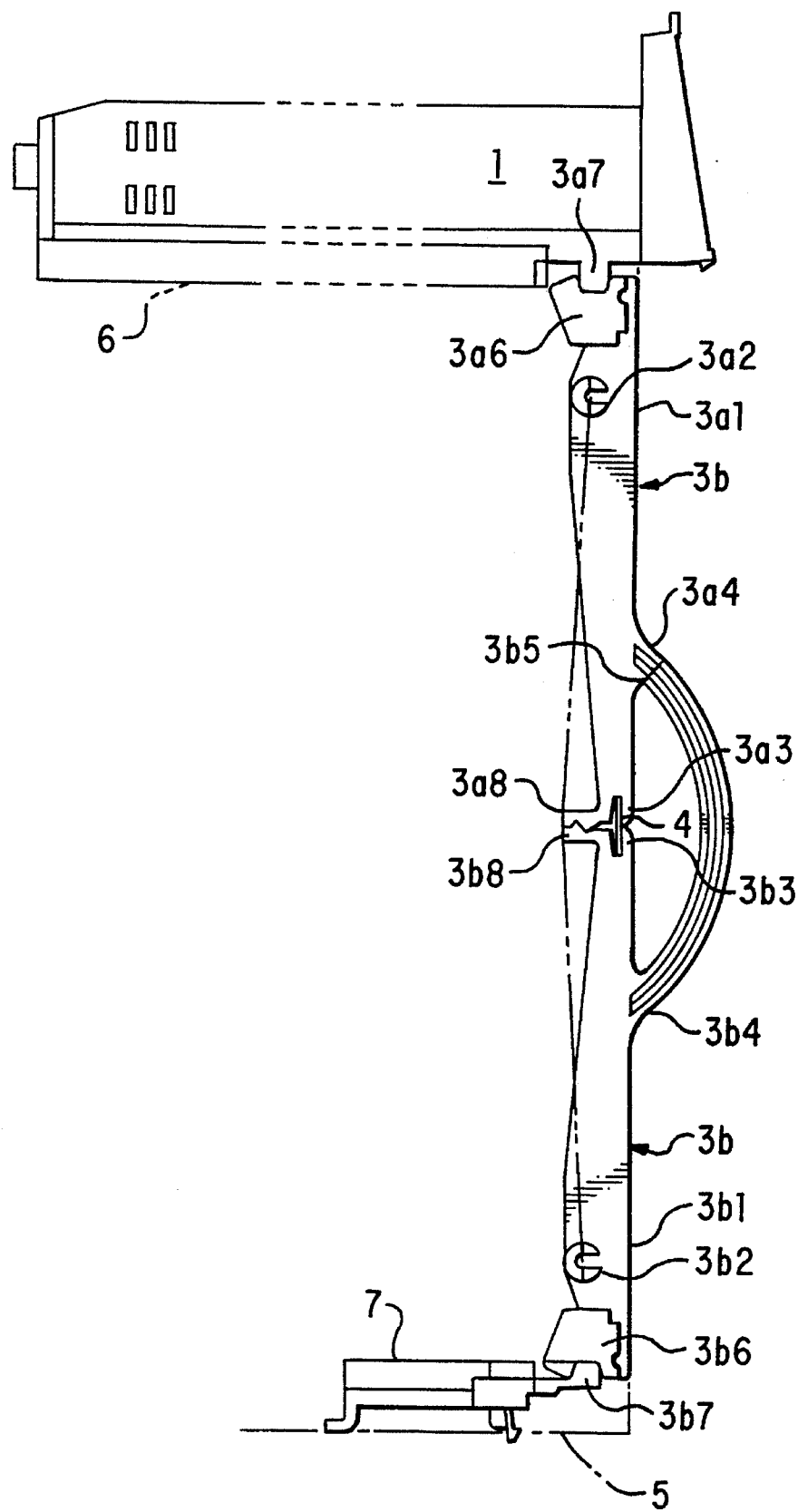
Figure 6:
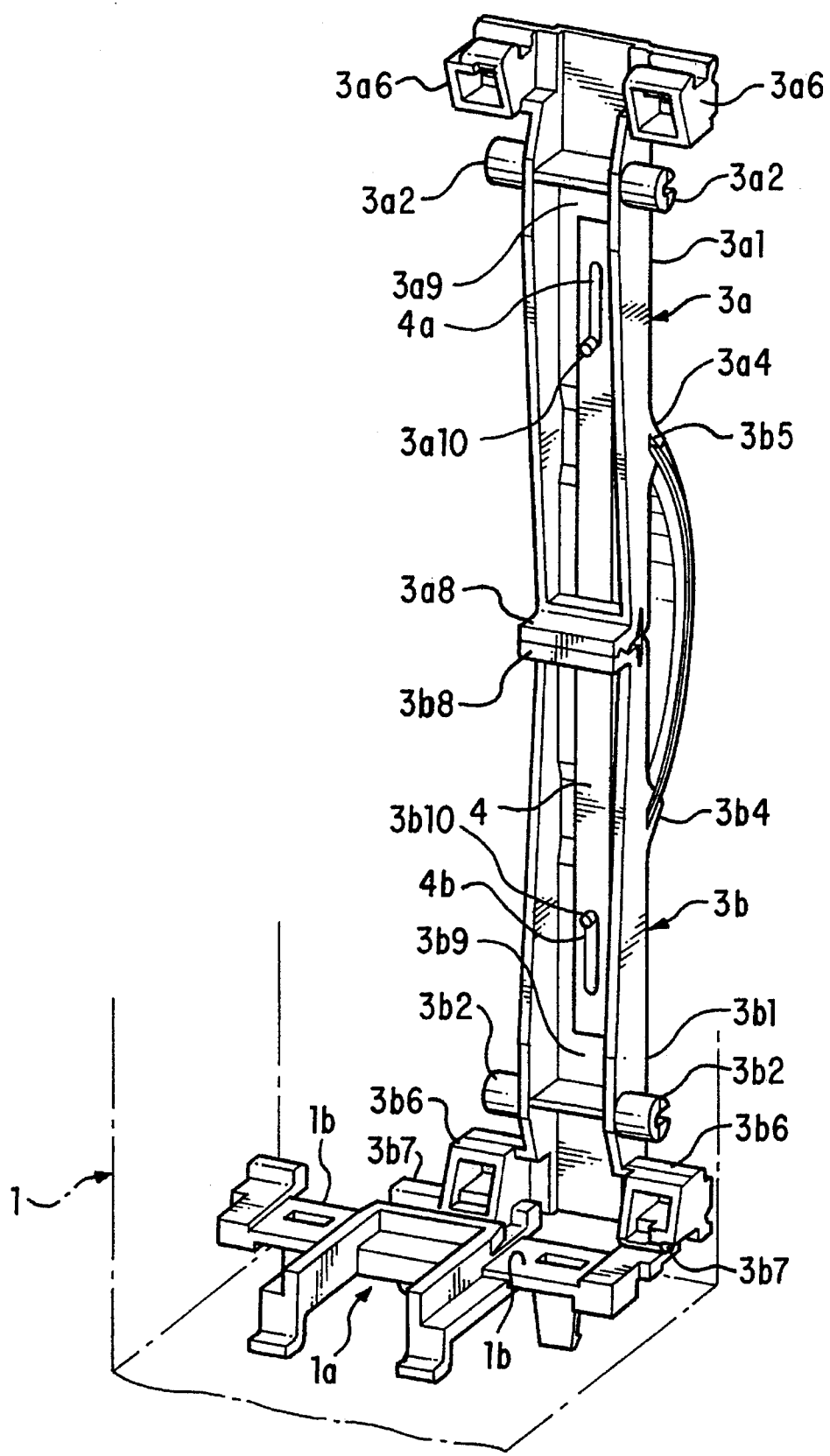
FIG. 6 is an isometric view of the lever mechanism according to this invention, particularly illustrating the longitudinally slidable disposition of a leaf spring in a position bridging the levers.
Figure 7:
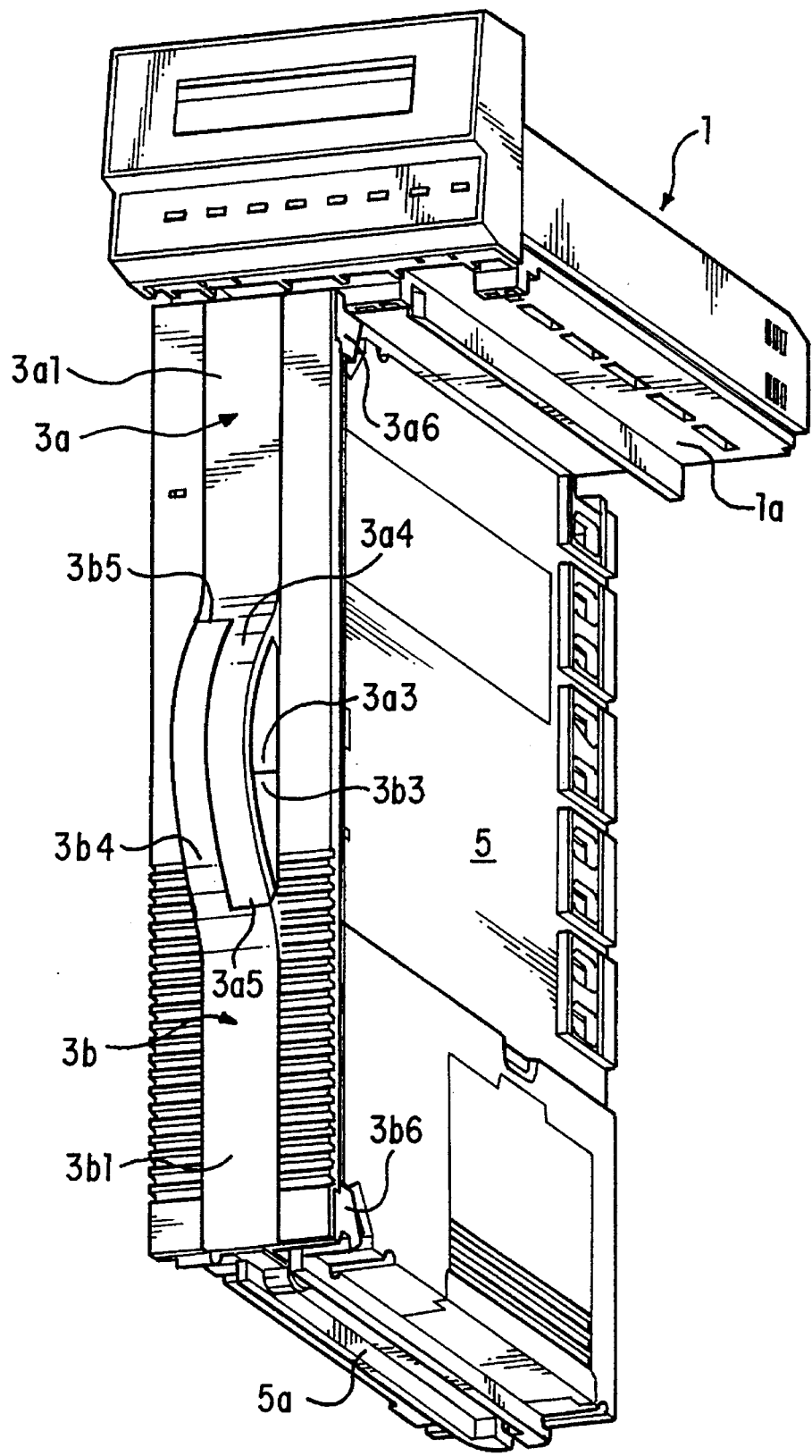
FIG. 7 is an isometric view of the module inserted in a guide in the system housing

As seen in FIGS. 6 and 7 in which fragmentary parts of the RAID system housing 1 are shown, that housing 1 is provided with a track structure 1a in the housing openings. The track structures 1a are provided with tracks 1b which receives the guides 5a, FIG. 7, on the top and bottom surfaces of the module 5. The track structure 1a has space for accommodating two modules 5 in side-by-side relationship, as seen in FIGS. 6 and 7. As seen in FIG. 4, when the module 5 is inserted to the housing 1 to locate it in a first position, levers 3a and 3b of the lever mechanism 3 are positioned in their released position. As the module 5 is inserted in to the housing 1, the trailing edges 3a61, 3b61, of the latch members 3a6, 3b6, engage their respective catch members 3a7, 3b7, of the housing 1. In this released position of the latch members 3a6, 3b6, their leading edges 3a62 and 3b62 pass over the catch members 3a7, 3b7. Engagement of the trailing edges 3a61, 3b61, of the latch members 3a6, 3b6 with the catch members 3a7, 3b7 arrest the insertion of the module 5 and align the module 5 in the housing 1. At this time, FIG. 4, manual force as indicated by the arrow is applied simultaneously to both of the arcuate sectors 3a4, 3b4, and in the presence of the stiffness restraint of the leaf spring 4, correspondingly angularly displaces the levers 3a, 3b. The leading edge 3a62, 3b62 of the latch members 3a6, 3b6, engage the respective catch members 3a7, 3b7, and, moving synchronously, insert the module 5 into the system housing 1 to locate it in a final position. Where connector parts are being engaged, this alignment of the top and bottom surfaces of the module 5 guarantees parallel presentation of a connector part on the module 5 with a mating connector part in the system housing 1 and provides the necessary force to securely engage the connector parts with the pins and pin receptacles in axial alignment.

An over center toggle mechanism comprises lateral toggle arms 3a8, 3b8, at the distal ends 3a3, 3b3, of the lever 3a, 3b. The confronting distal ends of these toggle arms 3a8, 3b8 are provided with interlocking surfaces which become engaged as the lever 3a, 3b, move toward latched position. When the lever arms 3a, 3b, are in fully latched position, the distal ends of the toggle arms 3a8, 3b8 are in compressional engagement and provide a force having a component acting about the pivots 3a2, 3b2, securing the levers 3a, 3b in latched position.

What is claimed is:

1. An interlock lever structure for installing and removing a device from an opening in a housing, comprising:

a. a pair of levers, each lever having a proximal end and a distal end;

b. a pair of spaced pivot structures mounted to said device, said pivot structures pivotally engaged to said levers at correspondingly positioned pivot points on said levers at said proximal ends, respectively, with said distal ends of said levers in confronting relationship, said levers having a released position and a latched position;

c. a leaf spring longitudinally slidably engaged with both of said levers including longitudinal sliding engagement with said levers at said distal ends;

d. a latch member mounted to each lever, the latch members being correspondingly spaced from the pivot points of the respective levers;

e. a catch member for each said latch member mounted to said housing in said opening;

f. said device for insertion into said opening in said housing with said levers in said released position, engaging each of said latch member with each of said catch member, movement of said levers from said released position to said latched position moving each of said latch member in engagement with each of said catch member, in a direction to displace said device from a first position to a final position in said opening in said housing, said latch member and said catch member remaining in engagement to permit removal of said device from said opening in said housing by moving said levers from latched position to released position thereby moving said device from said final position to said first position for manual removal from said opening in said housing, and h. handles for manually moving said levers comprising a handle on each of said levers, said handles being disposed in overlapping relationship across said distal ends of said levers for simultaneous manual engagement for moving said levers.

2. The interlocked lever structure according to claim 1, in which:

a. said levers are longitudinally aligned in said latched position and are correspondingly angularly displaced from longitudinal alignment in said released position.

3. The interlocked lever structure according to claim 2, in which:

a. during angular movement of said levers from said latched position to said released position said leaf spring slides with respect to at least one of said levers and, said leaf spring bowed there between, the stiffness of said leaf spring maintaining said distal ends of said levers in corresponding spatial positions.

4. The interlocked lever structure according to claim 3, in which:

a. sliding engagement of said leaf spring with said levers comprises means for centering said leaf spring with respect to said levers when said levers are aligned in said latched position.

5. The interlocked lever structure according to claim 1, in which:

a. said handles comprise arcuate sectors of the same radius.

6. The interlocked lever structure according to claim 5, in which:

a. said arcuate sectors of said handles are disposed in side-by-side relationship.

7. The interlocked lever structure according to claim 6, in which:

a. the radius for the arcuate sectors is chosen so that the radius in the latched position of the levers is equal to the radius in the released position of the levers so that the side-by-side overlapped relationship of said arcuate sectors of said handles is maintained throughout angular movement of said levers between latched and released positions.

8. The interlocked lever structure according to claim 1, further comprising:

a. a toggle arm laterally projecting from said distal end of each said lever, each toggle arm having a distal end, the distal ends being in compressional engagement when said levers are longitudinally aligned in said latched position producing a component of force at the distal end of each lever acting about said pivot structures, respectively, in a direction to maintain said levers in said latched position.

9. An interlocked lever structure for installing and removing a module in an opening in a housing, comprising:

a. a pair of levers, each lever having a proximal end and a distal end, each lever further having an arcuate sector branching therefrom and extending beyond said distal end, the arcuate sectors being of the same radius;

b. a pair of spaced pivot structures mounted to said module, said pivot structures pivotally engaging said levers at correspondingly positioned pivot points on said levers at said proximal ends, respectively, with said distal ends of said levers in confronting relationship and with said arcuate sectors of said levers in overlapping relationship, said levers having a released position and a latched position, said arcuate sectors having minimum overlap in said released position and maximum overlap in said latched position;

c. a leaf spring longitudinally slidably engaged with both of said levers including longitudinal sliding engagement at said distal ends;

d. a latch member mounted to each of said levers, said latch members being correspondingly spaced from the pivot points of the respective of said levers;

e. a catch member for each of said latch members mounted to said housing in said opening;

f. said module for insertion to a first position into said opening in said housing with said levers in said released position, engaging each of said latch members with each of said catch members, movement of said levers from said released position to said latched position increasing the overlap of said arcuate sectors of said levers and moving each of said latch members, in engagement with each of said catch members, in a direction to displace said module to a final position in said opening of said housing, said latch member and said catch member remaining in engagement to permit removal of said module from said opening in said housing by moving said levers to said released position, thereby moving said module to said first position.

\* \* \* \* \*